United States Patent

Ito

Patent Number: 5,929,711
Date of Patent: Jul. 27, 1999

[54] PLL CIRCUIT WITH PSEUDO-SYNCHRONIZATION CONTROL DEVICE

[75] Inventor: Shuhei Ito, Hamamatsu, Japan

[73] Assignee: Yamaha Corporation, Shizuoka-ken, Japan

[21] Appl. No.: 09/014,662

[22] Filed: Jan. 28, 1998

[30] Foreign Application Priority Data

Jan. 30, 1997 [JP] Japan ................................. 9-017180

[51] Int. Cl.$^6$ ........................... H03L 7/00; H03L 7/08
[52] U.S. Cl. ................... 331/1 A; 331/18; 331/25; 327/156; 327/159; 375/376; 348/536
[58] Field of Search ............................... 331/1 A, 14, 20, 331/25, 18; 348/536, 540; 327/156, 157, 159; 360/51; 375/376

[56] References Cited

U.S. PATENT DOCUMENTS 5,457,428  10/1995  Alder et al. ........................ 331/1 A
5,663,688  9/1997  Delmas et al. ........................ 331/14

FOREIGN PATENT DOCUMENTS 60-52501   11/1985   Japan.
3-41914    6/1991    Japan.
4-4796     1/1992    Japan.
4-154383   5/1992    Japan.

*Primary Examiner*—Arnold Kinkead
*Attorney, Agent, or Firm*—Hazel & Thomas, P.C.

[57] ABSTRACT

A PLL circuit includes a phase comparator that compares an external synchronizing signal and an internal synchronizing signal to detect a phase difference therebetween, and a voltage-controlled oscillator that generates the internal synchronizing signal by oscillation thereof. The frequency of the voltage-controlled oscillator is controlled depending upon the phase difference, so that the internal synchronizing signal becomes in phase with the external synchronizing signal. A limiting device is provided, which limits the phase of the external synchronizing signal supplied to the phase comparator to be within a predetermined window period that includes the timing of generation of the internal synchronizing signal.

8 Claims, 7 Drawing Sheets

FIG.8
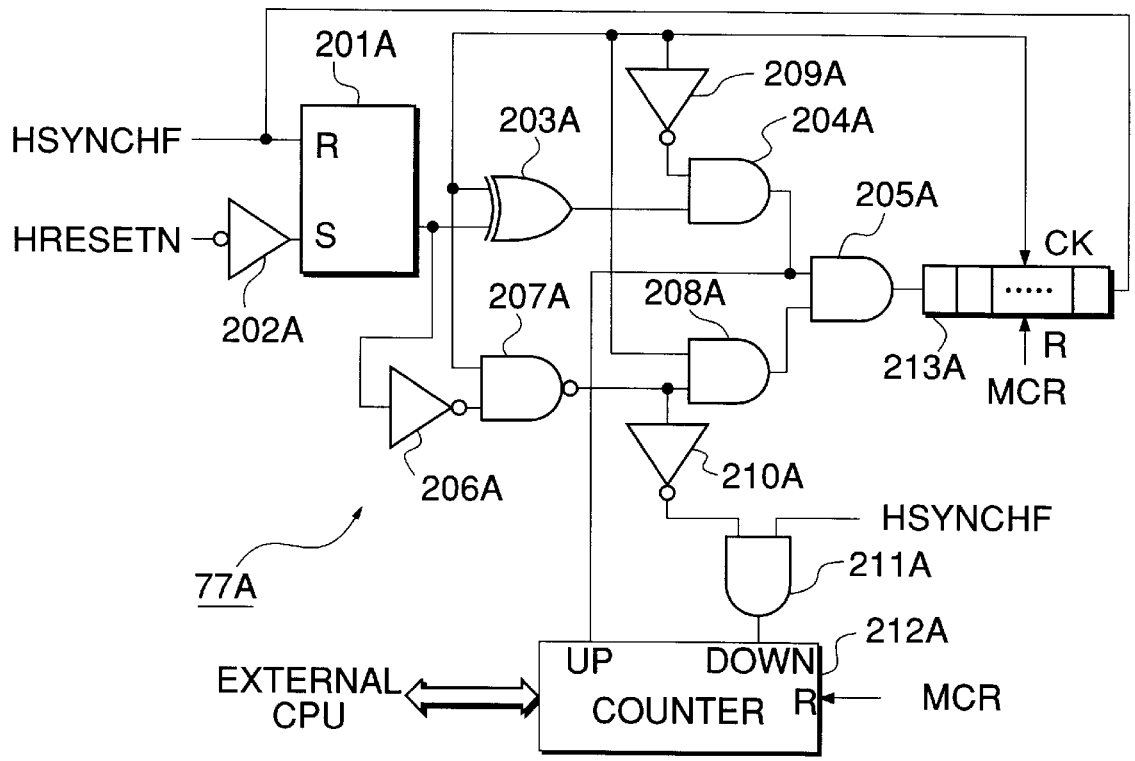
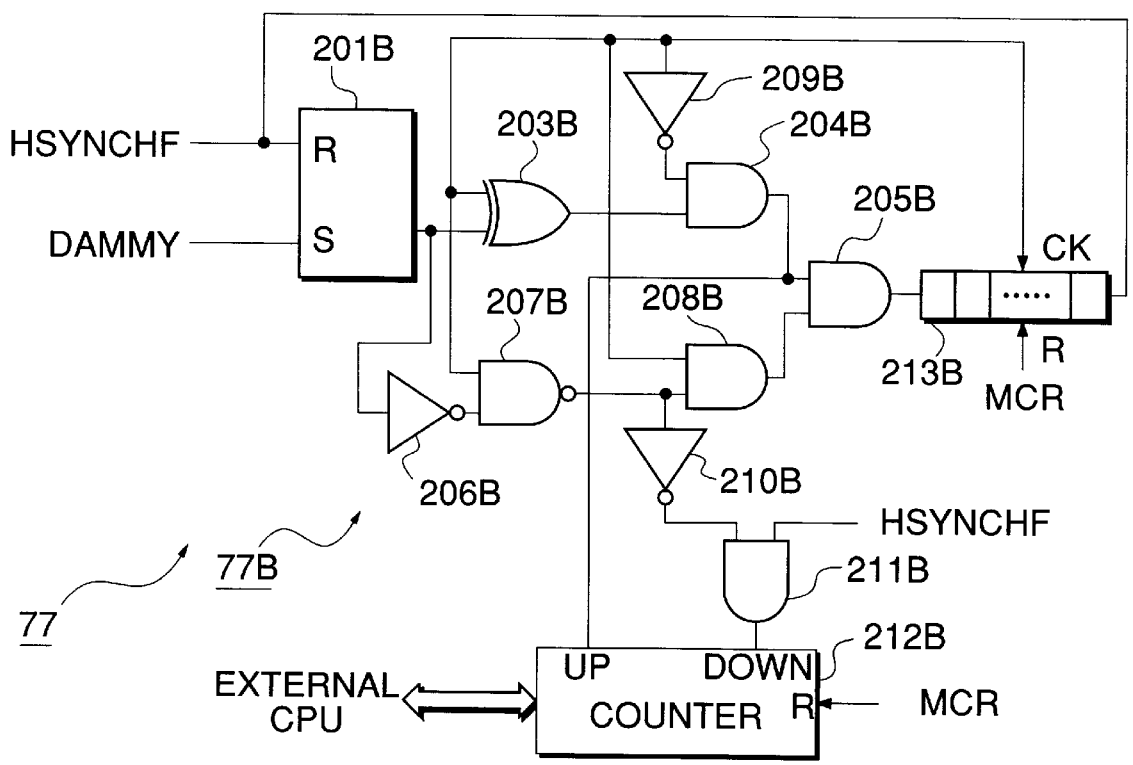

PLL CIRCUIT WITH PSEUDO-SYNCHRONIZATION CONTROL DEVICE

BACKGROUND OF THE INVENTION

1. Field of the Invention

The present invention relates to a PLL (phase-lock loop) circuit that generates a signal that is in phase with a signal supplied from the outside of the circuit.

2. Prior Art

The superimposing technique is known which is used to superimpose an image representing channels or clock, for example, which is produced by an image display device, on an image or picture of television or VCR, to display superimposed images. While display control of a television picture, or the like, is performed in synchronization with a horizontal synchronizing signal included in a picture signal, display control of channel or other representation superimposed on the television picture by the superimposing technique needs to be also performed in synchronization with the horizontal synchronization signal, so that the channel or other representation does not fluctuate or oscillate relative to the television picture. To meet with this need, a PLL circuit is generally used to produce a dot clock that is in phase with the horizontal synchronizing signal, and the image display device outputs an image signal for channel or other representation in synchronization with the dot clock.

As known in the art, the PLL circuit is a loop circuit that consists essentially of a phase comparator, a low pass filter (which will be referred to as LPF), and a voltage-controlled oscillator (which will be referred to as VCO). To provide a dot clock that is in phase with the horizontal synchronizing signal of the picture signal, the horizontal synchronizing signal is supplied to one of input terminals of the phase comparator of the PLL circuit. On the other hand, an output signal of VCO is divided by a frequency divider, and an output signal of this frequency divider is supplied to the other input terminal of the phase comparator. The phase comparator outputs a phase error signal that represents a phase error between the output signal of the frequency divider and the horizontal synchronizing signal. This phase error signal is supplied to VCO via LPF, and the oscillation frequency of the output signal of VCO is controlled so that the phase error or difference between the output signal of the frequency divider and the synchronizing signal is reduced. As this control proceeds under a condition where the synchronizing signal is stably supplied with a constant frequency, the phase error between the output signal of the frequency divider and the synchronizing signal is reduced with time, and the oscillation frequency of VCO is locked or fixed at a point of time when the phase error becomes zero. In this locked state, the output signal of VCO is in phase with the horizontal synchronizing signal, and therefore this output signal is used as a dot clock.

In the meantime, the latest model of television systems installed on automobiles, which have been rapidly prevailing in these days, is now equipped with a system, called car multivision, for displaying in-car information (such as control information about an audio system or air conditioning). This system employs the superimposing technique as described above to superimpose the in-car information produced by an image display device onto a television image to thereby display superimposed images. In this case, the system may not be able to receive the horizontal synchronization signal of the picture signal at a constant frequency, depending upon the receiving condition of radio waves, and the frequency of the horizontal synchronizing signal may temporarily fluctuate to a great extent.

If such a fluctuation in the frequency of the horizontal synchronizing signal occurs while the PLL circuit is held in the locked state, the oscillation frequency of VCO changes significantly due to a change in the phase error signal generated from the phase comparator, and the operation of the PLL circuit comes out of the locked state.

With the operation of the PLL circuit thus being out of the locked state, even if the horizontal synchronizing signal resumes its normal frequency, it still takes some time for the dot clock produced by the PLL circuit to be in phase with the horizontal synchronizing signal having the normal frequency. As a result, there arises a period in which the dot clock produced by the PLL circuit is out of phase with the horizontal synchronizing signal, and disturbance may occur in the image representing in-car information that is superimposed on the television picture for display.

While the illustrated example is concerned with the superimposing technique, the above problem is not limited to the case where the PLL circuit is used for controlling superimposing operations, but generally encountered in controls using the PLL circuit where a fluctuation occurs in the frequency of a reference signal (external synchronizing signal) that provides a basis for phase synchronization.

SUMMARY OF THE INVENTION

It is an object of the invention to provide a PLL circuit that is able to stably generate an internal synchronizing signal that is in phase with an external synchronizing signal, so that the phase of the internal synchronizing signal produced by the PLL circuit does not greatly deviate from that of the external synchronizing signal even if a temporary fluctuation occurs in the frequency of the external synchronizing signal that provides a basis for phase synchronization.

To attain the above object, according to a first aspect of the present invention, there is provided a PLL circuit including a phase comparator that compares an external synchronizing signal and an internal synchronizing signal to detect a phase difference therebetween, and a voltage-controlled oscillator that generates the internal synchronizing signal by oscillation thereof, and wherein a frequency of the voltage-controlled oscillator is controlled depending upon the phase difference, so that the internal synchronizing signal becomes in phase with the external synchronizing signal.

The PLL circuit according to the first aspect of the invention is characterized by comprising a limiting device that limits a phase of the external synchronizing signal supplied to the phase comparator to be within a predetermined window period that includes a timing of generation of the internal synchronizing signal.

To attain the object, according to a second aspect of the present invention, there is provided a PLL circuit including a phase comparator that compares an external synchronizing signal and an internal synchronizing signal to detect a phase difference therebetween, and a voltage-controlled oscillator that generates the internal synchronizing signal by oscillation thereof, and wherein a frequency of the voltage-controlled oscillator is controlled depending upon the phase difference, so that the internal synchronizing signal becomes in phase with the external synchronizing signal.

The PLL circuit according to the second aspect of the invention is characterized by comprising a pseudo synchronization control device that supplies the external synchronizing signal to the phase comparator when the external synchronizing signal is received within a predetermined window period including a timing of generation of the internal synchronizing signal, and supplies a pseudo synchronizing signal produced at one of first and second points of time when the window period starts and ends, in place of the external synchronizing signal, when the external synchronizing signal is not received in the window period.

Preferably, the pseudo synchronization control device supplies the pseudo synchronizing signal to the phase comparator at the first point of time when the window period starts, when the external synchronizing signal is received during a period from a point of time that is a predetermined time after the internal synchronizing signal is generated to a point of time when the window period starts, the pseudo synchronizing control device supplying the pseudo synchronizing signal to the phase comparator at the second point of time when the window period ends, when the external synchronizing signal is not received during a period from the point of time that is the predetermined time after the internal synchronizing signal is generated to the second point of time when the window period ends.

More preferably, the PLL circuit according to the second aspect further comprises a counting device that counts a number of times the external synchronizing signal is received during a period in which the internal synchronizing signal is generated n times (where n is integer), a reference synchronizing signal generating device that generates a reference synchronizing signal at a predetermined frequency, and a switching device that determines whether the external synchronizing signal is not received for a predetermined period of time or longer, depending upon a result of counting of the counting device, and supplies the reference synchronizing signal to the phase comparator, in place of the external synchronizing signal or the pseudo synchronizing signal, if the external synchronizing signal is not received for the predetermined period of time or longer.

Further preferably, the counting device comprises a first-in first-out type memory device that stores n-piece data (where n is an integer), a writing control device that writes a first value into the memory device when a signal to be counted is received, and writes a second value into the memory device when the signal to be counted is not received, and a counter that increments a count value by 1 when the first value is written into the memory device by the writing control device and the second value is read out from the memory device, and decrements the count value by 1 when the second value is written into the memory device by the writing control device and the first value is read out from the memory device.

Advantageously, the reference synchronizing signal generating device includes a frequency divider that divides a clock signal having a constant frequency so as to output the reference synchronizing signal, the frequency divider being reset by a signal generated by the pseudo synchronization control device.

In a preferred form of the invention, the PLL circuit according to the second aspect further comprising a first counting device that counts a number of times the external synchronizing signal is received during a period in which the internal synchronizing signal is generated n times (where n is integer), a reference synchronizing signal generating device that generates a reference synchronizing signal at a predetermined frequency, a second counting device that counts a number of times the pseudo synchronizing signal that replaces the external synchronizing signal is generated from the pseudo synchronization control device during a period in which the internal synchronizing signal is generated n times (where n is integer), a switching device that determines whether the external synchronizing signal is not received for a predetermined period of time or longer, depending upon a result of counting of the first counting device, and supplies the reference synchronizing signal to the phase comparator, in place of the external synchronizing signal or the pseudo synchronizing signal, if the external synchronizing signal is not received for the predetermined period of time or longer, and a window period automatic adjusting device that determines whether the external synchronizing signal is continuously received in a timing that is outside the window period, depending upon results of counting of the first and second counting devices, and increases a width of the window period when the external synchronizing signal is continuously received in the timing that is outside the window period.

Preferably, each of the first counting device and the second counting device comprises a first-in first-out type memory device that stores n-piece data (where n is an integer), a writing control device that writes a first value into the memory device when a signal to be counted is received, and writes a second value into the memory device when the signal to be counted is not received, and a counter that increments a count value by 1 when the first value is written into the memory device by the writing control device and the second value is read out from the memory device, and decrements a count value by 1 when the second value is written into the memory device by the writing control device and the first value is read out from the memory device.

According to the present invention, when the PLL circuit receives an external synchronizing signal that is out of phase by a given amount or more with respect to an internal synchronizing signal, the phase of the external synchronizing signal supplied to the phase comparator of the PLL circuit is limited to be within a predetermined window period including a timing of generation of the internal synchronizing signal. Therefore, even if the PLL circuit receives an irregular pulse of the external synchronizing signal that is shifted from its normal phase, the phase of the internal synchronizing signal is prevented from largely deviating from the phase of the external synchronizing signal that follows the irregular pulse. Accordingly, the PLL circuit can generate a stable internal synchronizing signal which is substantially constantly in phase with the external synchronizing signal.

The above and other objects, features, and advantages of the invention will become more apparent from the following detailed description taken in conjunction with the accompanying drawings.

BRIEF DESCRIPTION OF THE DRAWINGS

FIG. 8 is a block diagram showing the configuration of a monitor block appearing in FIG. 7.

DETAILED DESCRIPTION

The present invention will now be described in detail with reference to the drawings showing a preferred embodiment thereof.

A. WHOLE CONFIGURATION

Figure 1:
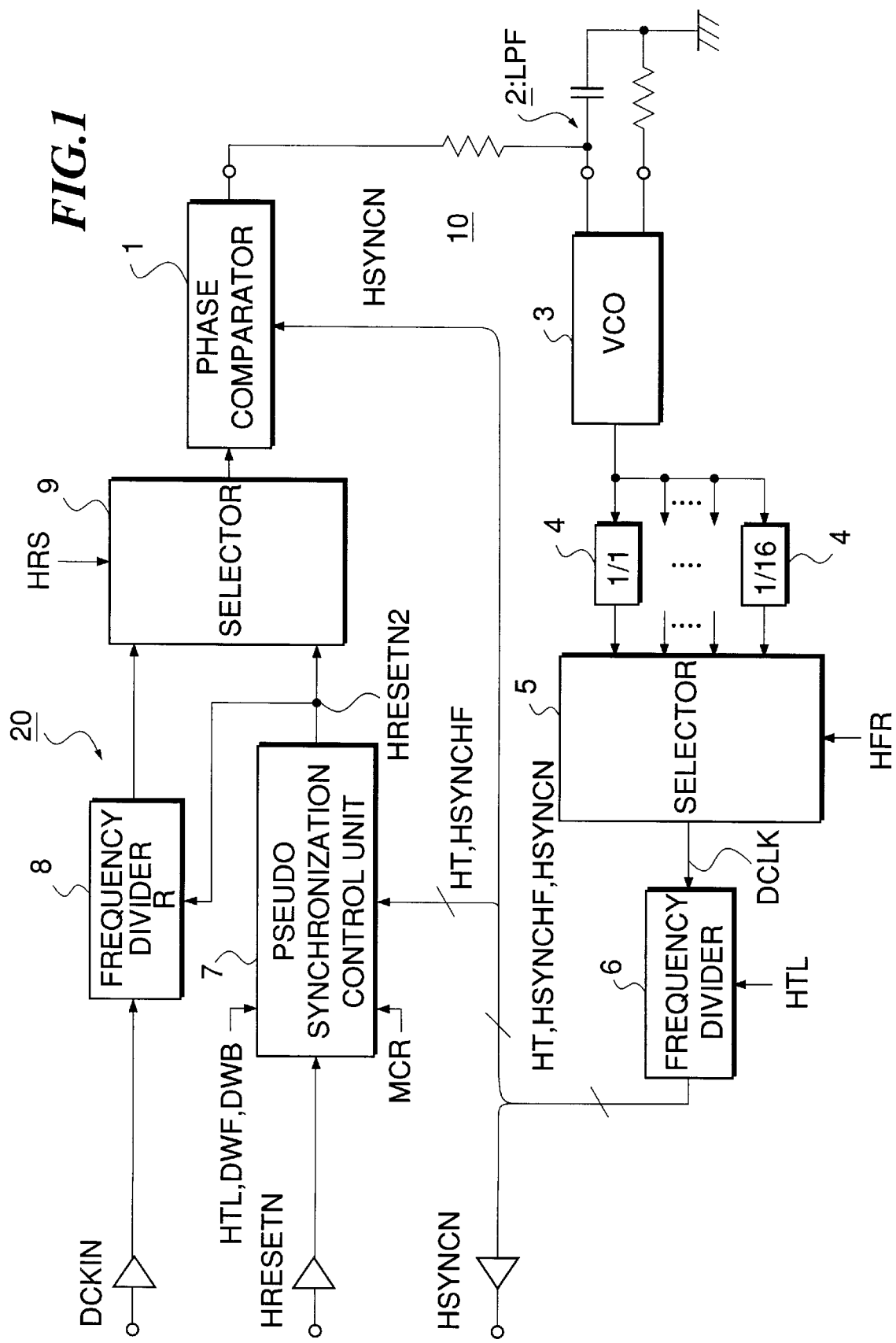
FIG. 1 is a block diagram showing the configuration of a PLL circuit according to one embodiment of the present invention.

FIG. 1 shows the configuration of a PLL circuit according to one embodiment of the present invention. The PLL circuit of the present embodiment is adapted to produce a dot clock DCLK which is in phase with a horizontal synchronizing signal (external synchronizing signal) separated from a picture signal of television.

The PLL circuit of this embodiment is roughly divided into two portions, namely, a loop circuit 10 and an input circuit 20. The loop circuit 10 is comprised of a phase comparator 1, a primary LPF 2 consisting of a resistor and a capacitor, VCO 3, frequency dividers 4, a selector 5, and a frequency divider 6. This loop circuit 10 performs the function of the conventional PLL circuit as described above in the Prior Art section.

The input circuit 20 as the other portion of the PLL circuit is comprised of a pseudo synchronization control unit 7, a frequency divider 8, and a selector 9. The function of this input circuit 20 will be summarized below.

The conventional PLL circuit as described above is constructed such that a horizontal synchronization signal is directly supplied to a phase comparator (phase comparator 1 in FIG. 1). In the PLL circuit of the present embodiment, the input circuit 20 normally supplies a horizontal synchronization signal HRESETN to the phase comparator 1, and a signal produced by the loop circuit 10 is controlled to be in phase with this horizontal synchronizing signal HRESETN.

It is, however, undesirable to control the signal produced by the loop circuit 10 to be in phase with the horizontal synchronizing signal HRESETN in such cases where a large fluctuation or change occurs in the period of the horizontal synchronizing signal HRESETN, and where the horizontal synchronizing signal HRESETN is not supplied for a certain continuous period of time.

In these cases, a synchronizing signal that replaces the horizontal synchronization signal HRESETN is supplied to the phase comparator 1 in the present embodiment, to thereby prevent the loop circuit 10 from largely deviating from its normal operating condition. The input circuit 20 serves to supply the phase comparator 1 with the synchronizing signal that replaces the horizontal synchronizing signal HRESETN.

The configurations and functions of the loop circuit 10 and input circuit 20 will be now explained in this order.

B. LOOP CIRCUIT

In the loop circuit 10, VCO 3 oscillates at an oscillation frequency corresponding to a voltage supplied via LPF 2, and the frequency dividers 4, divide the output signal of the VCO 3 at respective dividing ratios, to output the divided signals. The selector 5 selects one of the output signals of these frequency dividers 4, according to a selection signal HFR supplied from an external CPU (not illustrated), and outputs the selected signal as a dot clock DCLK.

The frequency divider 6 receives dividing ratio data HTL from an external CPU, and divides the dot clock DCLK at a dividing ratio 1/HTL, to output the resulting signal as an internal synchronizing signal HSYNCN. In this connection, the dividing ratio 1/HTL is determined by the ratio of the target frequency of the dot clock DCLK to the frequency of the horizontal synchronization signal HRESETN used as a reference frequency for phase synchronization. Thus, the frequency divider 6 is used as means for controlling the dot clock DCLK whereas the frequency dividers 4, as described above are used as means for allowing the VCO 3 to oscillate within a stable operating region, and enabling the selector 5 to generate a dot clock DCLK having a desired frequency. Namely, if the frequency dividers 4, are not used, and the output signal of the VCO 3 is directly used as a dot clock DCLK, the frequency of the dot clock DCLK that can be generated by the VCO 3 is limited to a frequency range in which the VCO 3 can perform stable oscillating operations. In the loop circuit 10 of the present embodiment, a signal obtained by dividing the output signal of the VCO 3 with a selected one of the frequency dividers 4, is used as a dot clock DCLK, so that the VCO 3 can oscillate in the frequency range in which this oscillator provides stable operating characteristics, regardless of the level of the frequency of the dot clock DCLK.

Figure 2:
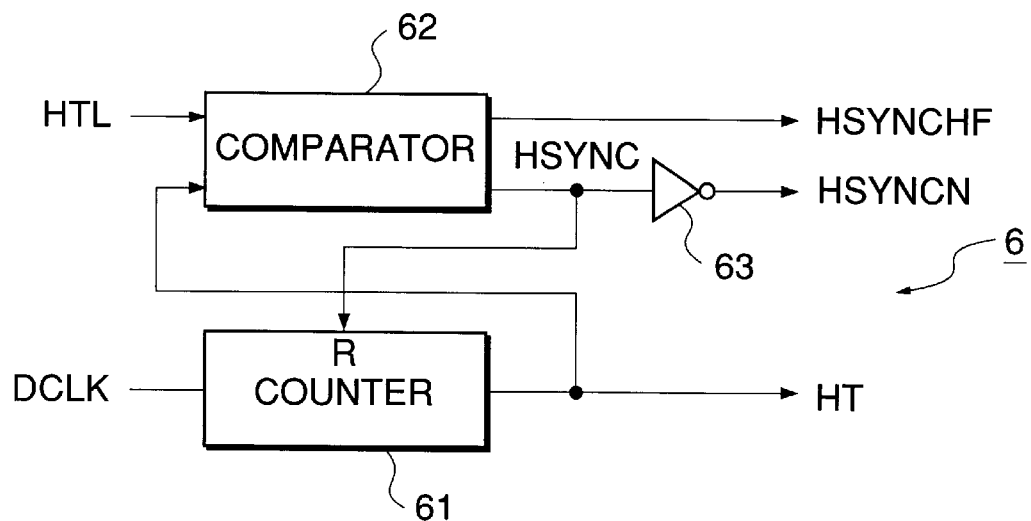
FIG. 2 is a block diagram showing the configuration of a frequency divider appearing in FIG. 1.
Figure 3:
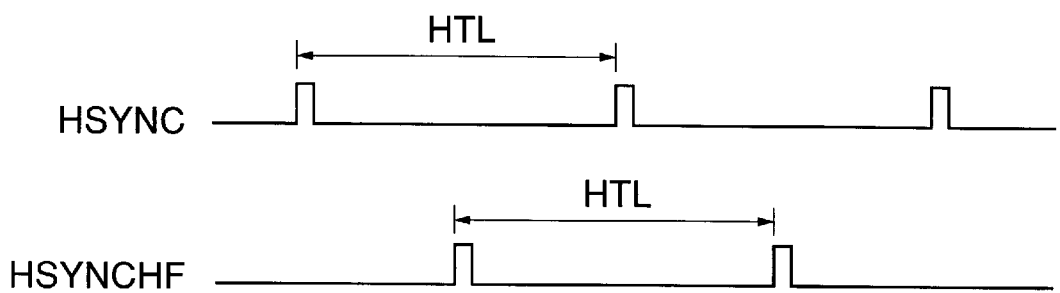
FIG. 3 is a time chart showing the operation of the frequency divider of FIG. 2.

FIG. 2 shows the configuration of the frequency divider 6, and FIG. 3 is a time chart showing the operation of the frequency divider 6. As shown in FIG. 2, the frequency divider 6 is comprised of a counter 61, a comparator 62, and an inverter 63. The counter 61 counts the dot clock DCLK supplied from the selector 5, and outputs a dot clock count value HT as a result of counting. The comparator 62 outputs a coincidence detection pulse (positive pulse) at a point of time when the dot clock count value HT reaches HTL, and also outputs a half-period synchronizing signal HSYNCHF at a point of time when the dot clock count value HT reaches HTL/2.

The counter 61 is reset by the coincidence detection pulse received from the comparator 62. The counter 61 keeps counting dot clock pulses DCLK from this reset state, and is reset each time the dot clock count value HT reaches HTL. With the counter 61 repeating this operation, the comparator 62 outputs coincidence detection pulses HSNC with a period that is HTL times as long as the period of the dot clock DCLK. The inverter 63 inverts each of the coincidence detection pulses HSYNC, and outputs the inverted pulse as an internal synchronizing signal HSYNCN. A half-period synchronizing signal HSYNCHF is generated at a half point of the period of the coincidence detection pulses HSYNC. FIG. 3 shows a phase relationship between the coincidence detection pulses HSYNC and half-period synchronizing signals HSYNCHF thus generated.

In FIG. 1, the phase comparator 1 detects a phase error between the internal synchronizing signal HSYNCN generated from the frequency divider 6 in the above manner, and the synchronizing signal supplied from the side of the input circuit 20 via the selector 9, and outputs a phase error signal. This phase error signal passes through the LPF 2, and is supplied to the VCO3 as the frequency-controlled voltage as described above, whereby the oscillation frequency of VCO 3 is controlled so as to eliminate the phase error.

C. INPUT CIRCUIT

Next, the input circuit 20 that supplies the above-described loop circuit 10 with a synchronizing signal that provides a basis for phase synchronization will be described in detail.

(1) Pseudo synchronization control unit

The PLL circuit of the present embodiment has two means for generating a synchronizing signal that provides a basis (reference frequency) for phase synchronization, one of which means is a pseudo synchronization control unit 7. This pseudo synchronization control unit 7 receives a half-period synchronizing signal HSYNCHF and dot clock count value HT from the frequency divider 6 as described above, and also receives a horizontal synchronizing signal separated from a television picture signal from the outside to the control unit 7. The pseudo synchronization control unit 7 then outputs a synchronizing signal HRESETN2 based on these signals.

Summary of function of pseudo synchronization control unit

Figure 4:
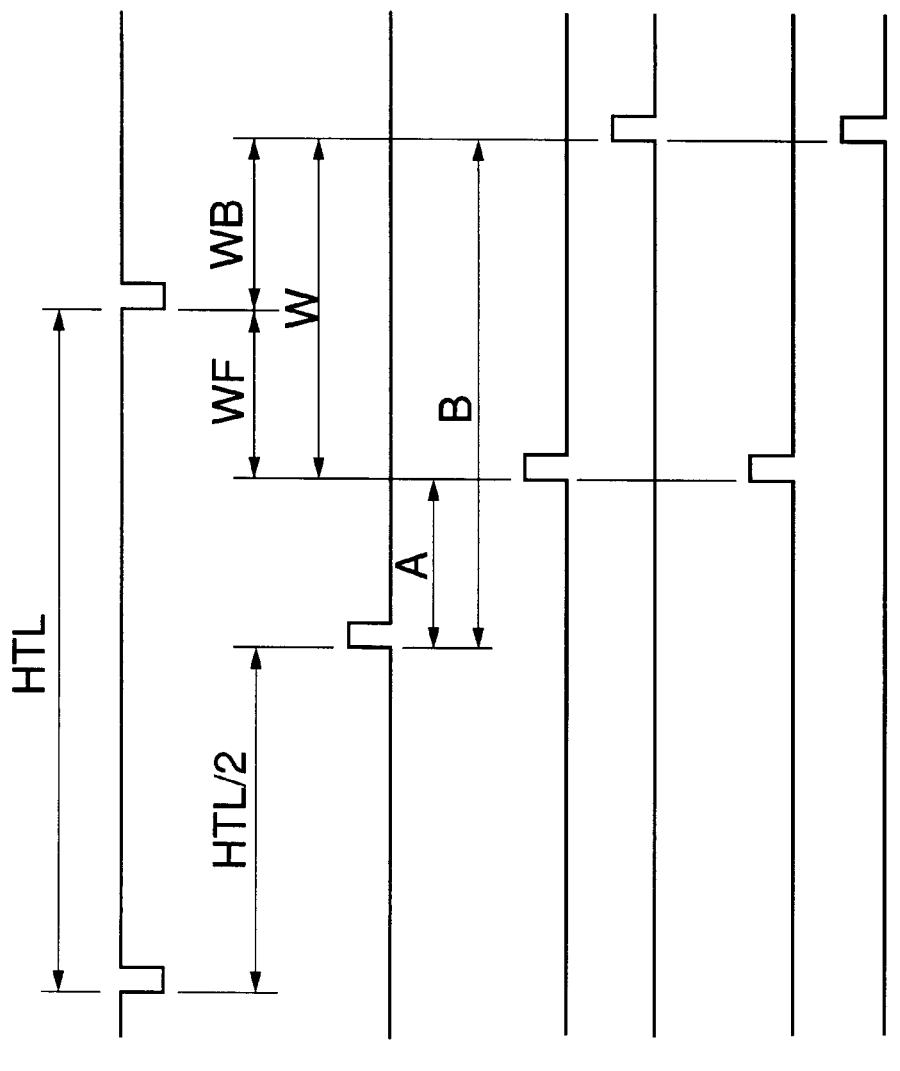
FIGS. 4(A–F) show the operation of a pseudo synchronization control unit appearing in FIG. 1.

FIG. 4 is a time chart showing the operation of the pseudo synchronization control unit 7 when it outputs a synchronizing signal HRESETN2. Before explaining details of the configuration of the pseudo synchronization control unit 7, the summary of the function of the pseudo synchronization control unit 7 will be explained with reference to this time chart, for the sake of easy understanding.

FIG. 4(a) shows a waveform of an internal synchronizing signal HSYNCN by way of example. The internal synchronizing signal HSYNCN is obtained by dividing a dot clock DCLK at the dividing ratio 1/HTL, and is therefore in the form of a pulse train (a series of negative pulses in this embodiment) having a period that is HTL times as long as the period of the dot clock DCLK.

In the present embodiment, a window period W is provided which corresponds to and also includes the timing of generation of the internal synchronizing signal HSYNC, namely, the timing of a fall of each negative pulse of the signal. This window period W is normally set to a time width that corresponds to an allowable range of fluctuation in the phase of the horizontal synchronizing signal HRESETN required for phase synchronization of the loop circuit 10. In the inside of the pseudo synchronization control unit 7, a pseudo synchronizing signal DWS is generated at a point of time when the window period W starts, and a pseudo synchronizing signal DWE is generated at a point of time when the window period W ends, as shown in FIGS. 4(c) and 4(d). The pseudo synchronization control unit 7 employs these pseudo synchronizing signals as needed, so as to output a synchronizing signal HRESETN2 in the manner as described below.

a. When a horizontal synchronizing signal HRESETN is received in the window period W, the pseudo synchronization control unit 7 outputs this horizontal synchronization signal HRESETN as it is as a synchronizing signal HRESETN2.

b. When a horizontal synchronizing signal HRESETN is not received in the window period W, the pseudo synchronization control unit 7 outputs a pseudo synchronizing signal generated at either the start point or end point of the window period W, in place of the horizontal synchronizing signal HRESETN.

More specifically, suppose a horizontal synchronizing signal HRESETN is received in a period A (FIG. 4(b)) from a point of time when a time corresponding to one half of the dot clock period HTL, i.e., HTL/2, elapses after generation of an internal synchronizing signal HSYNCN (namely, when a half-period synchronizing signal HSYNCHF is generated as shown in FIG. 4(b)), to a point of time when the window period W starts. In this case, the pseudo synchronization control unit 7 outputs a pseudo synchronizing signal DWS generated at the start point of the window period W as the synchronizing signal HRESETN2, instead of this horizontal synchronizing signal HRESETN (refer to FIGS. 4(c) and 4(e)).

If a horizontal synchronizing signal HRESETN is not received within a period B from the point of time when a time corresponding to one half of the dot clock period HTL, i.e., HTL/2, elapses after generation of an internal synchronizing signal HSYNCN, to a point of time when the window period W immediately after the synchronizing signal ends, the pseudo synchronization control unit 7 outputs a pseudo synchronizing signal DWE generated at the end point of the window period W as the synchronizing signal HRESETN2, in place of this horizontal synchronizing signal HRESETN (refer to FIG. 4(d) and FIG. 4(f)).

The operation described just above is performed not only when a horizontal synchronizing signal HRESETN is received after the end of the window period W, but also when no horizontal synchronizing signal HRESETN is received at all. Namely, after the start of the window period W, the pseudo synchronization control unit 7 waits for any input of horizontal synchronizing signal HRESETN until the end of the window period W. If no horizontal synchronizing signal is received by the time when the window period W ends, a pseudo synchronizing signal DWE is output as a synchronizing signal HRESETN2 in this timing of the end of the period W, irrespective of whether any horizontal synchronizing signal will be received later or not.

Thus, the pseudo synchronization control unit 7 normally outputs a synchronizing signal HRESETN2 having the same phase as the incoming horizontal synchronizing signal HRESETN. If this control unit 7 receives a horizontal synchronizing signal that is significantly out of phase with the internal synchronizing signal HSYNCN, however, the control unit 7 outputs a synchronizing signal HRESETN 2 while limiting this fluctuation of the phase so that a phase difference between the horizontal synchronizing signal HRESETN and the internal synchronizing signal HSYNCN does not exceed the upper limit value (WF and WB in FIG. 4).

Configuration of pseudo synchronization control unit

Figure 5:
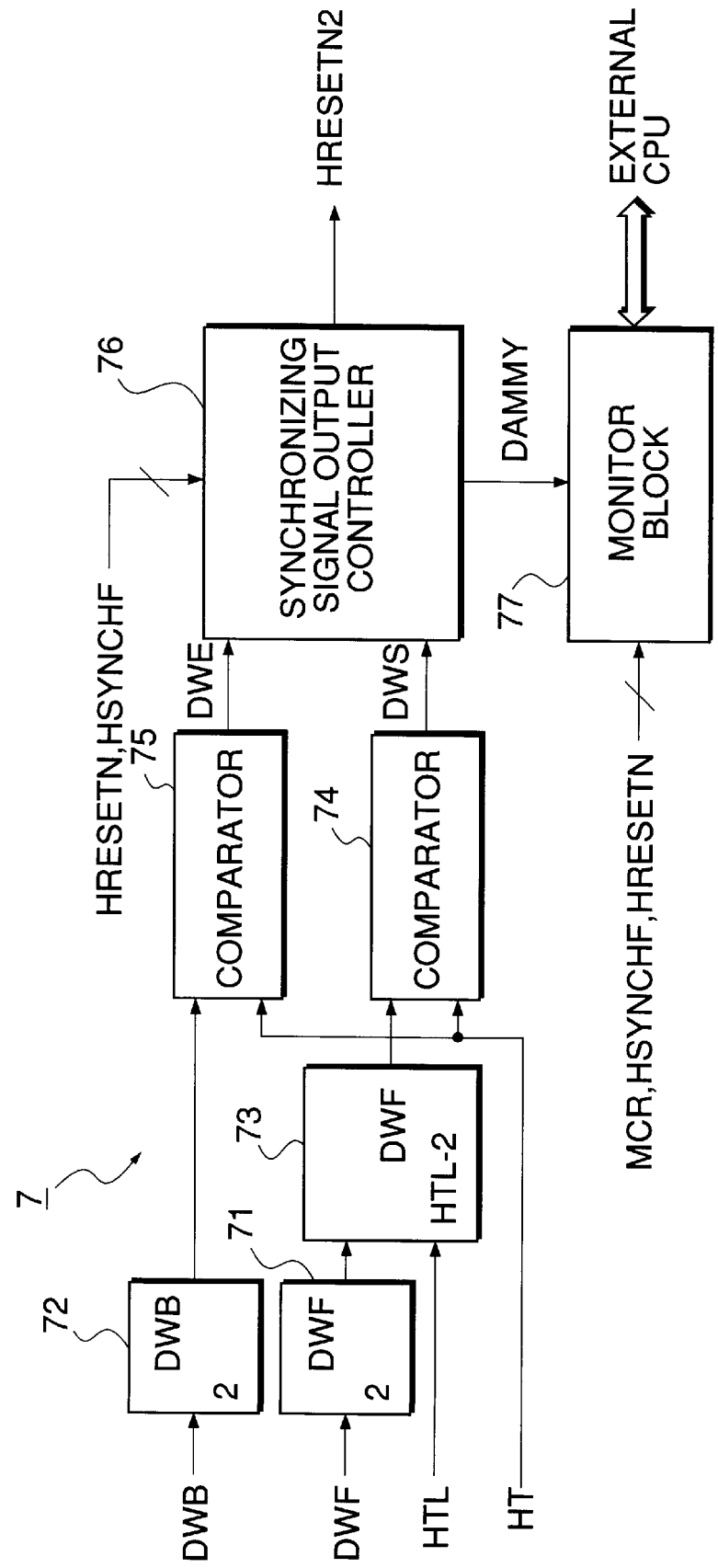
FIG. 5 is a block diagram showing the configuration of the pseudo synchronization control unit of FIG. 4.

FIG. 5 shows the configuration of the pseudo synchronization control unit 7 that performs the function as described above. This pseudo synchronization control unit 7 is comprised of exponentiation circuits 71, 72, a subtracter 73, comparators 74, 75, a synchronizing signal output controller 76, and a monitor block 77.

i) Pseudo synchronizing signal generating means

The exponentiation circuits 71, 72 receive window period setting information DWF and DWB, respectively, which are generated by the external CPU. These window period setting information DWF and DWB are used for defining the periods WF and WB in FIG. 4(b), respectively. The exponentiation circuits 71, 72 output respective data $2^{DWF}$ and $2^{DWR}$ upon receipt of these window period setting information DWF and DWB. The subtracter 73 subtracts data $2^{DWF}$ from dividing ratio data HTL, and outputs the result HTL−$2^{DWF}$ of subtraction.

Comparator 74 compares the dot clock count value HT generated from the frequency divider 6 (FIG. 1) with the result HTL−$2^{DWF}$ generated from the subtracter 73. Then, the comparator 74 outputs a pseudo synchronizing signal DWS during a period in which the dot clock count value HT is equal to HTL−$2^{DWF}$. As already explained above, the dot clock count value HT is reset by the internal synchronizing signal HSYNC, and is incremented by the counter 61 in the frequency divider 6 each time a dot clock signal DCLK is generated. Accordingly, a pseudo synchronizing signal DWS having a pulse width corresponding to one period of dot clock DCLK is generated from the comparator 74 at the point of time when (HTL−$2^{DWF}$) pulses of dot clock DCLK are generated after the internal synchronizing signal HSYNC is generated. In this manner, the pseudo synchronizing signal DWS is generated at a point of time that is earlier by the period WF than the timing of generation of the next internal synchronizing signal HSYNC. The period WF in this case may be set as desired by the window period setting information DWF, and has a length that is $2^{DWF}$ times as long as the period of the dot clock DCLK.

Similarly, the comparator 75 compares the dot clock count value HT with $2^{DWB}$ generated from the exponentiation circuit 72. The comparator 75 then outputs a pseudo synchronization signal DWE at a point of time when the dot clock count value HT becomes equal to $2^{DWB}$, which is later by the period WB than the timing of generation of the internal synchronization signal HSYNC, as shown in FIG. 4(d). The period WB in this case has a length that is $2^{DWB}$ times as long as the period of the dot clock DCLK.

ii) Synchronizing signal output controller

The synchronizing signal output controller 76 receives pseudo synchronizing signals DWS and DWE from the comparators 74, 75, and also receives the horizontal synchronizing signal HRESETN from the outside of the circuit and the half-period synchronizing signal HSYNCHF from the frequency divider 6 (FIG. 1). The synchronizing signal output controller 76 outputs a synchronizing signal HRESERN2 as explained above referring to FIG. 4, based on these signals.

Figure 6:
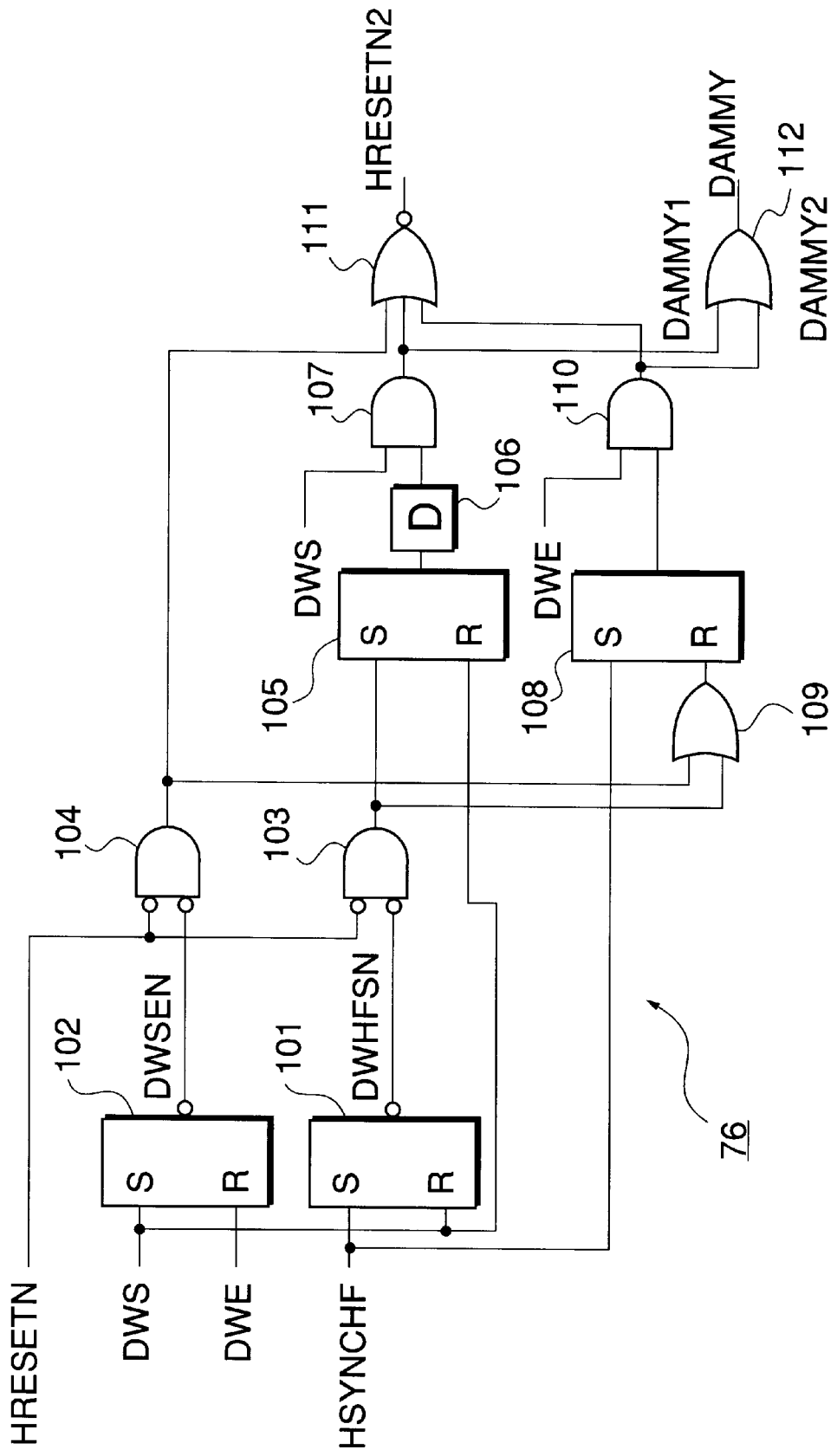
FIG. 6 is a block diagram showing the configuration of a synchronizing signal output controller appearing in FIG. 5.
Figure 7:
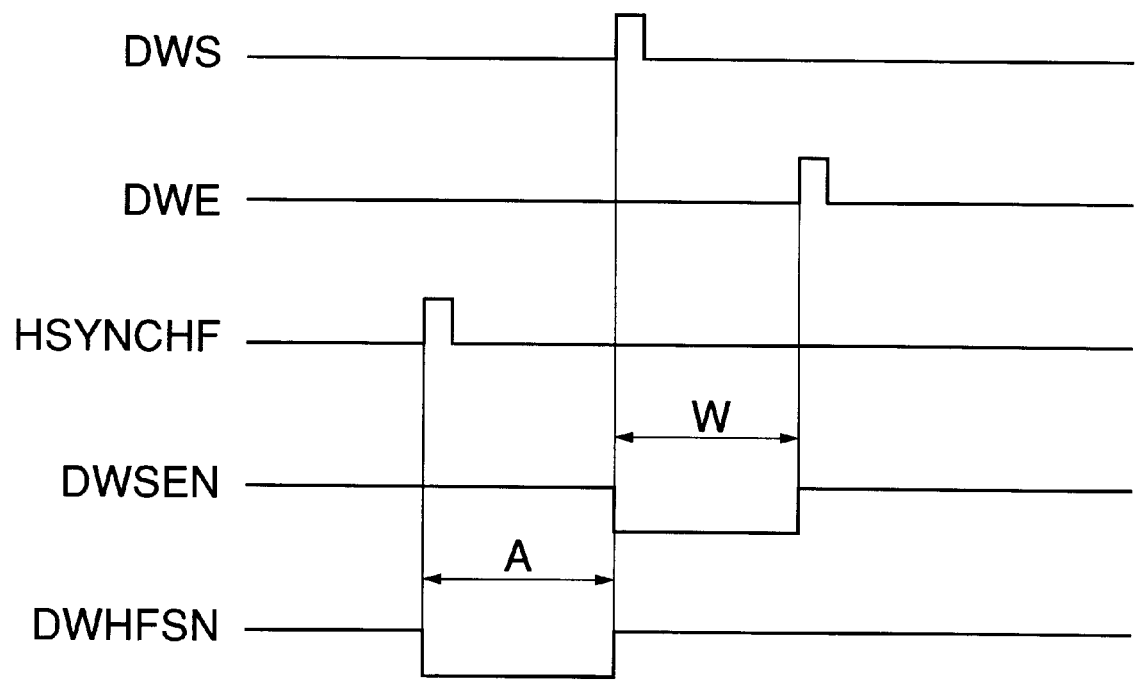
FIG. 7 is a time chart showing the operation of the synchronizing signal output controller of FIG. 6.

FIG. 6 shows the configuration of the synchronizing signal output controller 76. FIG. 7 is a time chart showing waveforms of respective signals transmitted through the synchronizing signal output controller 76. In FIG. 6, a flip-flop 101 is set by the half-period synchronizing signal HSYNCHF, and reset by the pseudo synchronizing signal DWS. Accordingly, an output signal DWHFSN (low active) generated from a negative logic output terminal of the flip-flop 101 is held at a low level only during the period A in FIG. 4 above, namely, during a period from the timing of generation of the half-period synchronizing signal HSYNCHF to the timing of generation of the pseudo synchronizing signal DWS, as shown in FIG. 7.

Flip-flop 102 is set by the pseudo synchronizing signal DWS, and reset by the pseudo synchronizing signal DWE. Accordingly, an output signal DWSEN (low active) generated from a negative logic output terminal of the flip-flop 102 is held at a low level only during the window period W in FIG. 4 above, namely, during a period from the timing of generation of the pseudo synthesizing signal DWS to the timing of generation of the pseudo synthesizing signal DWE, as shown in FIG. 7.

The output signal DWSEN of the flip-flop 102 is supplied to one of negative logic input terminals of an AND gate 104, and the horizontal synthesizing signal HRESETN is supplied to the other negative logic input terminal of the AND gate 104. Since the signal DWSEN is held at a low level only during the window period W in FIG. 4 as described above, only the horizontal synchronizing signal HRESETN entered during this window period W passes through the AND gate 104.

The output signal DWHFSN of the flip-flop 101 is supplied to one of negative logic input terminals of an AND gate 103, and the horizontal synchronizing signal HRESETN is supplied to the other negative logic input terminal of the AND gate 103. Since the signal DWHFSN is held at the low level only during the period A in FIG. 4, the horizontal synchronizing signal HRESETN entered during this period A passes through the AND gate 103.

Flip-flop 105 is set by the horizontal synchronizing signal HRESETN supplied thereto via the AND gate 103, and reset by the pseudo synchronizing signal DWS. Accordingly, an output signal of the flip-flop 105 is set to a high level when it receives the horizontal synchronizing signal HRESETN in the period A in FIG. 4, and is kept at the high level during a period from the timing of input of the signal HRESETN to the end point of the period A.

The output signal of the flip-flop 105 is supplied to one of positive logic input terminals of an AND gate 107 via a delay device 106, and the pseudo synchronizing signal DWS is supplied to the other positive logic input terminal of the AND gate 107. The output signal of the flip-flop 105 that has been set to a high level by the horizontal synchronizing signal HRESETN is changed into a low level at the time of generation of the pseudo synchronizing signal DWS, but this change is transmitted to the AND gate 107 via the delay device 106. Accordingly, when a horizontal synchronizing signal HRESETN is received during the above-described period A, the output signal of the delay device 106 still maintains the high level at the time of generation of the pseudo synchronizing signal DWS, and the pseudo synchronizing signal DWS passes through the AND gate 107, and is output from the gate 107 as a signal DAMMY1.

Flip-flop 108 is reset by the half-period synchronizing signal HSYNCHF. The reset terminal of the flip-flop 108 receives output signals of the AND gates 103 and 104 via an OR gate 109.

As explained above, the horizontal synchronizing signal HRESETN received in the period A passes through the AND gate 104, and the horizontal synchronizing signal HRESETN received in the window period W passes through the AND gate 103. Accordingly, if a horizontal synchronizing signal HRESETN is received in the period B in FIG. 4 above, this horizontal synchronizing signal HRESETN is transmitted to the reset terminal of the flip-flop 108, via the AND gate 103 or 104 and the OR gate 109, to reset the flip-flop 108. When any horizontal synchronizing signal HRESETN is not received in the period B in FIG. 4 above, namely, when a horizontal synchronizing signal HRESETN is received after the period B or no horizontal synchronizing signal HRESETN is received at all, the flip-flop 108 is not reset, and its output signal is kept at a high level.

The output signal of the flip-flop 108 is supplied to one of positive logic input terminals of an AND gate 110, and the pseudo synchronizing signal DWE is supplied to the other positive logic input terminal of the AND gate 110. When a horizontal synchronizing signal HRESETN is received in the period B as described above, to reset the flop-flop 108, the pseudo synchronizing signal DWE is inhibited from passing through the AND gate 110. When no horizontal synchronizing signal HRESETN is received in the period B, however, the output signal of the flip-flop 108 is kept at the high level, and therefore the pseudo synchronizing signal DWE passes through the AND gate 110, and is output from this gate 110 as a signal DAMMY2.

The output signals of the AND gates 104, 107 and 110 are supplied to a NOR gate 111, which in turn outputs a synchronizing signal HRESETN2. The relationship between the output timing of this synchronizing signal HRESETN2 and the horizontal synchronizing signal HRESETN will be described below.

In the case where a horizontal synchronizing signal HRESETN is received in the period A, the pseudo synthesizing signal DWS is supplied to the NOR gate 111 via the AND gate 107. Accordingly, a synchronizing signal HRESETN2 is generated from the NOR gate 111 at a point of time when the window period W starts.

In the case where a horizontal synchronizing signal HRESETN is received in the window period W, this horizontal synchronizing signal HRESETN is supplied to the NOR gate 111 via the AND gate 104. Accordingly, a synchronizing signal HRESETN2 that is exactly in phase with the horizontal synchronizing signal HRESETN is generated from the NOR gate 111.

In the case where any horizontal synchronizing signal HRESETN is not received in the period B, the pseudo synthesizing signal DWE is supplied to the NOR gate 111 via the AND gate 110. Accordingly, a synchronizing signal HRESETN2 is generated from the NOR gate 111 at a point of time when the window period W ends.

When a signal DAMMY1 or DAMMY2 is generated from the AND gate 107 or 110, respectively, an OR gate 112 outputs the signal DAMMY1 or DAMMY2 as its output signal DAMMY. This signal DAMMY is supplied to the monitor block 77 shown in FIG. 5.

iii) Monitor block

The monitor block 77 serves to monitor the operation of the synchronizing signal output controller 76, to be always aware of the following information:

a. The number of times K1 the horizontal synchronizing signal HRESETN was received during a period in which half-period synchronizing signals HSYNCHF were generated n times (namely, during a period in which internal synchronizing signals were generated n times).

b. The number of times K2 the pseudo synchronizing signal DWS or DWE was generated as a synchronizing signal HRESETN2, in place of the horizontal synchronizing signal HRESETN, during a period in which half-period synchronizing signals HSYNCHF were generated n times.

This number K2 is the sum of the number of times the horizontal synchronizing signal HRESETN is received outside the window period W, and the number of times no horizontal synchronizing signal HRESETN is received during a period from the time when an internal synchronizing signal HSYNCN is generated until the time when the next internal synchronizing signal HSYNCN is generated.

FIG. 8 shows the configuration of the monitor block 77. This monitor block 77 is comprised of a synchronizing signal monitor block 77A that obtains the number of times K1 as described above, and a synchronizing signal monitor block 77B that obtains the number of times K2 as described above.

The synchronizing signal monitor block 77A will be first described. Flip-flop 201A is reset by the half-period synchronizing signal HSYNCHF, and set by the horizontal synchronizing signal HRESETN supplied thereto via an inverter 202A. Accordingly, the flip-flop 201A outputs "1" where the horizontal synchronizing signal HRESETN is received within one period (period of the half-period synchronizing signal HSYNCHF) as counted from the point of time when a half-period synchronizing signal HSYNCHF is generated. The flip-flop 201A outputs "0" when no horizontal synchronizing signal HRESETN is received within the above-indicated one period.

The synchronizing signal monitor block 77A also includes a shift register 213A which is a first-in first-out type memory device consisting of n-stage registers (n is integer, for example n=64). When counting of the number of times K1 of input of the horizontal synchronizing signal is started, this shift resister 213 receives a clear signal MCR from the external CPU, and the contents of all of the n-piece registers are set to "0". Thereafter, the shift register 213 operates in synchronization with the half-period synchronizing signal HSYNCHF, to perform writing of input data into the first-stage register, and shifting operations between the resisters.

An output signal of the flip-flop 201A is transmitted to the first-stage data input terminal of the shift register 213, through the first path of XOR gate 203A, AND gate 204A, and OR gate 205A in this order, or the second path of inverter 206A, AND gate 207A, AND gate 208A, and OR gate 205A in this order. The output signal is then written into the first-stage register of the shift register 213A upon receipt of a half-period synchronizing signal HSYNCHF.

In the above operation, which one of the first and second paths is used to transmit data that is to be written into the first-stage register is selected depending upon what data was written into the same register when the shift register 213A received a half-period synchronizing signal HSYNCH (n+1) periods earlier. This will be described in greater detail below.

When a half-period synchronizing signal HSYNCHF is generated, the shift register 213A outputs data from the last-stage register, which data was written into the first-stage register when a half-period synchronizing signal HSYNCHF was received n periods earlier. Accordingly, at the point of time when the current half-period synchronizing signal HSYNCHF is generated, the shift resister 213A is outputting data that was written into the shift register 213A when it received a half-period synchronizing signal HSYNCH (n+1) periods earlier.

If the data received (n+1) periods earlier, which is now being generated from the shift register 213A, is "1", the AND gate 204A of the first path receives "0" via an inverter 209A, and the AND gates 207A and 208A of the second path receive "1". Accordingly, the output signal of the flip-flop 201A is supplied to the shift register 213A via the second path. If the data received (n+1) periods earlier is "0", on the other hand, the first path is used to transmit data (output of the flip-flop 201A) to the shift register 213A. Thus, the output signal of the flip-flop 201A is supplied as it is to the shift register 213A via one of the two paths, without being inverted no matter which of the paths is used to transmit the output signal. Accordingly, the n-piece registers constituting the shift register 213A always store output signal values of the flip-flop 201A, which are respectively received at the timing of generation of n-piece half-period synchronizing signals HSYNCHF that have been generated until this point of time.

Counter 212A serves to count the number of times K1 of input of the horizontal synchronizing signal HRESETN. When the number of times K1 of input of the horizontal synchronizing signal HRESETN starts being counted, the above-indicated clear signal MCR is also supplied to this counter 212A. As a result, the count value of the counter 212 is set to "0". Thereafter, the count value of the counter 212A is incremented upon a rise of an input signal to its UP terminal, and is decremented upon a rise of an input signal to its DOWN terminal.

The UP terminal of the counter 212A receives an output signal of the AND gate 204A of the first path. The output signal of the AND gate 204 rises only when the flip-flop 201A is set by a horizontal synchronizing signal HRESETN while the output signal of the last-stage register of the shift register 213A is "0". Accordingly, the count value of the counter 212A is incremented only in the case where a horizontal synchronizing signal HRESETN is received while the oldest output signal value of the flip-flop 201A stored in the shift register 213A (data that is about to be discarded upon generation of the next internal synchronizing signal HSYNCN) is "0".

The DOWN terminal of the counter 212, on the other hand, receives an output signal of an AND gate 211A. This AND gate 211A receives the half-period synchronizing signal HSYNCHF and a signal obtained by inverting the output signal of the NAND gate 207A of the second path by an inverter 210A. The output signal value of the inverter 210A is equal to "1" when the oldest output signal value of the flip-flop 201A stored in the shift register 213A is "1" and at the same time the current output signal of the flip-flop 201A is "0". If a half-period synchronizing signal HSYNCHF is generated in this state, the output signal of the AND gate 211A rises under the above conditions, to thereby decrement the count value of the counter 212A, and the current output signal "0" of the flip-flop 201A is written into the shift register 213A.

In the manner as described above, the count value of the counter 212A is incremented when the number of signals whose value is "0", among the n-piece output signals of the flip-flop 201A that have been stored in the shift register 213A, is reduced by one, and a signal whose value is "1" is newly added to the shift register 213A. On the other hand, the count value of the counter 212A is decremented when the number of signals whose value is "1", among the n-piece output signals of the flip-flop 201A that have been stored in the shift register 213A, is reduced by one, and a signal whose value is "0" is newly added to the shift register 213A. Accordingly, the count value of the counter 212A represents the number of signals whose value is "1", among the n-piece signals stored in the shift register 213A. Namely, this count value always represent the number of times K1 of input of the horizontal synchronizing signal HRESETN during the period in which the half-period synchronizing signal HSYNCHF was generated n times. The count value of this counter 212A is read by the external CPU.

The pseudo synchronizing signal monitor block 77B has substantially the same configuration as the synchronizing signal monitor block 77A as described above, and elements 201B–213B that constitute the pseudo synchronizing signal monitor block 77B respectively correspond to elements 201A–213A constituting the synchronizing signal monitor block 77A. It is, however, to be noted that the flip-flop 201B of the pseudo synchronizing signal monitor block 77B is set by a signal DAMMY, rather than a horizontal synchronizing signal HRESETN.

In the synchronizing signal output controller 76 of the pseudo synchronizing control unit 7 (as shown in FIG. 6), the signal DAMMY is generated when the pseudo synchronizing signal DWS or DWE is generated as a synchronizing signal HRESETN2, namely, as an output signal of the output controller 76, in place of the horizontal synchronizing signal HRESETN. Accordingly, the count value of the counter 212B of the pseudo synchronizing signal monitor block 77B always represents the number of times K2 the pseudo synchronizing signal DWS or DWE was output as the synchronizing signal HRESETN2, in place of the horizontal synchronizing signal HRESETN, during the period in which the half-period synchronizing signal HSYNCHF was generated n times. The count value of the counter 212B is also read by the external CPU.

The details of the monitor block 77 have been described above.

(2) Reference synchronizing signal generating means

Referring back to FIG. 1, other constituent elements of the PLL circuit of the present embodiment will be now explained. While the pseudo synchronizing control unit 7 serves to generate a synchronizing signal that provides a basis (reference frequency) for phase synchronization of the loop circuit 10, as already explained above, the PLL circuit of the present embodiment further includes a means for generating a synchronizing signal that provides this basis. Namely, a crystal oscillator (not illustrated) is connected to this PLL circuit, and the frequency divider 8 shown in FIG. 1 divides a dot clock DCKIN having a constant frequency, which is obtained by oscillation of this crystal oscillator, to generate a reference synchronizing signal. In this case, the external CPU supplies a dividing ratio FC to the frequency divider 8. Also, the frequency divider 8 is reset by the synchronizing signal HRESETN2 generated from the pseudo synchronization control unit 7.

(3) Switching means and means for automatically adjusting window period

The selector 9 selects one of output signals of the pseudo synchronization control unit 7 and frequency divider 8, according to a selection signal HRS supplied by the external CPU (not illustrated), and supplies the selected output signal to the phase comparator 1.

The external CPU controls each part of the PLL circuit in the manner as described below, referring to each count value of the counters 212A and 212B of the monitor block 77 (FIG. 8).

a. In the case where the count value K1 of the counter 212A is equal to "n" or sufficiently close to "n", and the count value K2 of the counter 212B is sufficiently small.

In this case, it is supposed that the horizontal synchronizing signal HRESETN is stably received by the PLL circuit, and the internal synchronizing signal HSYNCN is in phase with the horizontal synchronizing signal HRESETN. Accordingly, the external CPU maintains the current state.

In this state, a transient fluctuation may occur in the phase of the horizontal synchronizing signal HRESETN, and a single pulse of the horizontal synchronizing signal HRESETN may be irregularly received by the PLL circuit at a time outside of the window period W. In such a case, however, a pseudo synchronizing signal occurring upon the start or end of the window period W is supplied to the phase comparator 1 of the loop circuit 10, in place of the horizontal synchronizing signal HRESETN, and therefore the phase of the internal synchronizing signal HSYNCN is prevented from largely deviating from the phase of the horizontal synchronizing signal HRESETN that follows the above irregular pulse of the signal. Thus, the internal synchronizing signal HSYNCN generated by the loop circuit 10 can be kept in phase with the horizontal synchronizing signal HRESETN with high stability.

b. In the case where the count value K1 of the counter 212A is considerably small as compared with "n"

In this case, it is supposed that the horizontal synchronizing signal HRESETN has not been received for a certain period of time or longer. Therefore, the external CPU switches the selection signal HRS so that the output signal of the frequency divider 8 is selected by the selector 9. With the selection signal HRS thus switched, the phase comparator 1 receives, via the selector 9, a reference synchronizing signal provided by dividing a stable dot clock DCKIN obtained from the crystal oscillator by the frequency divider 8. Accordingly, the loop circuit 10 operates in synchronization with the phase of this reference synchronizing signal. Before the selector 9 is switched to the reference synchronization signal, the frequency divider 8 has been reset by the synchronizing signal HRESETN2 generated from the pseudo synchronization control unit 7. After switching, therefore, the reference synchronizing signal having substantially the same phase as this synchronizing signal HRESETN2 can be supplied to the phase comparator 1, thereby avoiding an increase in the level of the phase error signal due to the switching. Thus, in the present embodiment, the internal synchronizing signal HSYNCN can be generated with high stability even in the case where the input of the horizontal synchronizing signal HRESETN is interrupted for a while.

c. In the case where the count value K2 of the counter 212B is increased

In this case, the external CPU refers to the count value K1 of the counter 212A. If the count value K1 is equal to "n" or sufficiently close to "n", it is supposed that the horizontal synchronizing signal HRESETN is stably received by the PLL circuit, but there is a high possibility that the phase of the internal synchronizing signal HSYNCN is completely out of phase with that of the horizontal synchronizing signal HRESETN, and the horizontal synchronizing signal HRESETN is continuously received in timing outside the window period W. In this case, the external CPU changes the window period defining information DWF and DWB to increase the width of the window period W, so that the loop circuit 10 operates in accordance with the horizontal synchronizing signal HRESETN.

d. In the case where the count value K2 of the counter 212B has been sufficiently reduced after expanding the window period W in the above case c.

In this case, it is supposed that the loop circuit 10 operates in accordance with the horizontal synchronizing signal HRESETN, and pulses of the horizontal synchronizing signal HRESETN are always received in the window period W. The external CPU then changes the width of the window period W back to a width that substantially accommodates normal variations in the phase of the horizontal synchronizing signal HRESETN.

In the present embodiment as described above, when the internal synchronizing signal HSYNCN and the horizontal synchronizing signal HRESETN are out of phase, the window period W is automatically expanded so as to make these synchronizing signals in phase with each other. After the internal synchronizing signal HSYNCN is made in phase with the horizontal synchronizing signal HRESETN, the window period W is changed back to the original period having a relatively narrow width. Thus, the PLL circuit of the present embodiment satisfies both of a requirement for high accordance of the internal synchronizing signal HSYNCN with the horizontal synchronizing signal HSYNCN, and a requirement for high stability in the phase of the internal synchronizing signal HSYNCN.

While the present invention is applied to the PLL circuit that generates a dot clock signal that is in phase with a horizontal synchronizing signal of a television in the illustrated embodiment, the present invention is not limited to this, but may be applied to PLL circuits used in other applications.

What is claimed is:

1. In a PLL circuit including a phase comparator that compares an external synchronizing signal and an internal synchronizing signal to detect a phase difference therebetween, and a voltage-controlled oscillator that generates the internal synchronizing signal by oscillation thereof, and wherein a frequency of the voltage-controlled oscillator is controlled depending upon the phase difference, so that the internal synchronizing signal becomes in phase with the external synchronizing signal, the improvement comprising:

a pseudo synchronization control device that supplies the external synchronizing signal to said phase comparator when the external synchronizing signal is received within a predetermined window period including a timing of generation of the internal synchronizing signal, and supplies a pseudo synchronizing signal produced at one of first and second points of time when said window period starts and ends, in place of the external synchronizing signal, when the external synchronizing signal is not received in said window period.

2. A PLL circuit according to claim 1, wherein said pseudo synchronization control device supplies the pseudo synchronizing signal to said phase comparator at the first point of time when said window period starts, when the external synchronizing signal is received during a period from a point of time that is a predetermined time after the internal synchronizing signal is generated to a point of time when said window period starts, said pseudo synchronizing control device supplying the pseudo synchronizing signal to said phase comparator at the second point of time when said window period ends, when the external synchronizing signal is not received during a period from said point of time that is said predetermined time after the internal synchronizing signal is generated to the second point of time when the window period ends.

3. A PLL circuit according to claim 1, further comprising:

a counting device that counts a number of times the external synchronizing signal is received during a period in which the internal synchronizing signal is generated n times (where n is an integer);

a reference synchronizing signal generating device that generates a reference synchronizing signal at a predetermined frequency; and a switching device that determines whether the external synchronizing signal is not received for a predetermined period of time or longer, depending upon a result of counting of said counting device, and supplies the reference synchronizing signal to said phase comparator, in place of the external synchronizing signal or the pseudo synchronizing signal, if the external synchronizing signal is not received for said predetermined period of time or longer.

4. A PLL circuit according to claim 3, wherein said counting device comprises a first-in first-out type memory device that stores n-piece data (where n is an integer), a writing control device that writes a first value into said memory device when a signal to be counted is received, and writes a second value into the memory device when the signal to be counted is not received, and a counter that increments a count value by 1 when said first value is written into said memory device by said writing control device and said second value is read out from said memory device, and decrements the count value by 1 when said second value is written into said memory device by the writing control device and said first value is read out from the memory device.

5. A PLL circuit according to claim 3, wherein said reference synchronizing signal generating device includes a frequency divider that divides a clock signal having a constant frequency so as to output said reference synchronizing signal, said frequency divider being reset by a signal generated by said pseudo synchronization control device.

6. A PLL circuit according to claim 1, further comprising:

a first counting device that counts a number of times the external synchronizing signal is received during a period in which the internal synchronizing signal is generated n times (where n is an integer);

a reference synchronizing signal generating device that generates a reference synchronizing signal at a predetermined frequency;

a second counting device that counts a number of times the pseudo synchronizing signal that replaces the external synchronizing signal is generated from said pseudo synchronization control device during a period in which the internal synchronizing signal is generated n times (where n is an integer);

a switching device that determines whether the external synchronizing signal is not received for a predetermined period of time or longer, depending upon a result of counting of said first counting device, and supplies the reference synchronizing signal to said phase comparator, in place of the external synchronizing signal or the pseudo synchronizing signal, if the external synchronizing signal is not received for said predetermined period of time or longer; and a window period automatic adjusting device that determines whether the external synchronizing signal is continuously received in a timing that is outside said window period, depending upon results of counting of said first and second counting devices, and increases a width of the window period when the external synchronizing signal is continuously received in the timing that is outside the window period.

7. A PLL circuit according to claim 6, wherein each of said first counting device and said second counting device comprises a first-in first-out type memory device that stores n-piece data (where n is an integer), a writing control device that writes a first value into said memory device when a signal to be counted is received, and writes a second value into the memory device when the signal to be counted is not received, and a counter that increments a count value by 1 when said first value is written into said memory device by said writing control device and said second value is read out from said memory device, and decrements a count value by 1 when the second value is written into the memory device by the writing control device and the first value is read out from the memory device.

8. A PLL circuit according to claim 6, wherein said reference synchronizing signal generating device includes a frequency divider that divides a clock signal having a constant frequency so as to output said reference synchronizing signal, said frequency divider being reset by a signal generated by said pseudo synchronizing control device.

* * * * *